(12) United States Patent
Yang et al.

(10) Patent No.: US 7,132,363 B2
(45) Date of Patent: Nov. 7, 2006

(54) STABILIZING FLUORINE ETCHING OF LOW-K MATERIALS

(75) Inventors: Kai Yang, San Jose, CA (US); Darrell M. Erb, Los Altos, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,056

(22) Filed: Mar. 27, 2001

(65) Prior Publication Data

US 2002/0140101 A1 Oct. 3, 2002

(51) Int. Cl.
*H01L 21/4763* (2006.01)

(52) U.S. Cl. .............. 438/639; 438/631; 438/633; 438/638; 438/675; 438/687

(58) Field of Classification Search ............. 438/687, 438/978, 713, 700–701, 675, 672–673, 667–668, 438/637–640, 627–628
See application file for complete search history.

(56) References Cited

U.S. PATENT DOCUMENTS

| | | | |
|---|---|---|---|
| 5,821,168 A | | 10/1998 | Jain |
| 5,916,823 A | | 6/1999 | Lou et al. |
| 5,966,634 A | * | 10/1999 | Inohara et al. ............. 438/687 |
| 6,017,817 A | * | 1/2000 | Chung et al. ............. 438/622 |
| 6,040,243 A | | 3/2000 | Li et al. |
| 6,090,699 A | * | 7/2000 | Aoyama et al. ............. 438/622 |
| 6,207,585 B1 | * | 3/2001 | Hasegawa et al. ............ 438/763 |
| 6,284,657 B1 | * | 9/2001 | Chooi et al. ................ 438/637 |
| 6,333,260 B1 | | 12/2001 | Kwon et al. |
| 6,372,636 B1 | * | 4/2002 | Chooi et al. ................ 438/639 |
| 6,492,270 B1 | * | 12/2002 | Lou ............................ 438/687 |
| 6,521,533 B1 | | 2/2003 | Morand et al. |
| 6,683,002 B1 | * | 1/2004 | Chooi et al. ................ 438/687 |
| 6,919,638 B1 | * | 7/2005 | Huang et al. ............... 257/756 |
| 2001/0006255 A1 | * | 7/2001 | Kwon et al. ................ 257/751 |
| 2001/0051420 A1 | | 12/2001 | Besser et al. |
| 2002/0111013 A1 | * | 8/2002 | Okada et al. ............... 438/627 |

FOREIGN PATENT DOCUMENTS

| | | |
|---|---|---|
| FR | 2 798 512 | 9/1999 |
| FR | 2798512 A | 3/2001 |
| WO | WO 00/39849 | 7/2000 |

OTHER PUBLICATIONS

Wolf "silicon processing for the visi era" 1986, vol. 1, pp. 193-195.*
Wolf et al. "silicon processing for the VLSI" 1986, vol. 1, pp. 191-196.*
Database WPI, Derwent Publications Ltd., London, GB: AN 2000-670923, XP002216560 & KR 2000 002 928 A abstract -& US 6 333 260 B1 (Shin Hong-Jae et al) Dec. 26, 2001 (Dec. 25, 2001) column 8, line 35 -column 10, line 12: figures 6-9.

* cited by examiner

*Primary Examiner*—Thanh Nguyen

(57) ABSTRACT

Damascene processing is implemented with dielectric barrier films (50, 90, 91) for improved step coverage and reduced contact resistance. Embodiments include the use of two different dielectric films (50, 31) to avoid misalignment problems. Embodiments further include dual damascene (100A, 100B) processing using Cu metallization (100).

15 Claims, 10 Drawing Sheets

STABILIZING FLUORINE ETCHING OF LOW-K MATERIALS

TECHNICAL FIELD

The present invention relates to semiconductor devices having interconnection patterns with barrier films. The present invention is particularly applicable to ultra large-scale integrated circuit (ULSI) devices having features in the deep sub-micron regime.

BACKGROUND ART

As integrated circuit geometries continue to plunge into the deep sub-micron regime, the issues confronted by integration technology increase in number and severity. Demands for ULSI semiconductor wiring require increasingly denser arrays with minimal spacings between narrower conductive lines. Implementation becomes problematic in manufacturing semiconductor devices having a design rule of about 0.13 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via hole is typically formed by depositing an interlayer dielectric (ILD) on a patterned conductive layer comprising at least one conductive feature, forming an opening through the ILD by conventional photolithographic and etching techniques, and filling the opening with a conductive material. The excess conductive material or overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), titanium-tungsten (TiW), Tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein a first dielectric layer, such as a silicon oxide layer, e.g., derived from tetraethyl orthosilicate (TEOS) or silane, or a low dielectric constant material, i.e., a material having a dielectric constant of no greater than 4 (with a dielectric constant of 1 representing a vacuum), is formed over an underlying pattern having a capping layer thereon, e.g., a Cu or Cu alloy pattern with a silicon nitride capping layer. A barrier layer and optional seedlayer are then deposited, followed by Cu deposition, as by electrodeposition or electroless deposition.

In implementing conventional interconnect technology, such as damascene technology, particularly employing Cu metallization, various issues become particularly acute as the feature size continues to plunge into the deep sub-micron regime. For example, the use of a conventional metallic barrier film, such as Ta, TaN, TiN, WN and W, becomes problematic in various respects. These metallic barrier films exhibit a higher electrical resistivity than Cu, aluminum or silver. Moreover, various barrier metal films, particularly Ta and TaN, the barrier metal layers of choice, can only be deposited employing physical vapor deposition (PVD) techniques, such as sputtering. Such conventionally sputtered films exhibit poor conformal step coverage. Moreover, as feature sizes are reduced, electromigration and capacitance issues become acute along with the step coverage and resistivity problems. It also becomes more difficult to accommodate misalignment problems in multi-level interconnection technology.

Accordingly, there exists a need for improved interconnection technology, particularly for Cu damascene techniques, addressing issues generated by reduced feature sizes, such as poor step coverage, contact resistivity, electromigration, capacitance and misalignment. There exists a particular need for such improved interconnection technology for Cu damascene processing involving a highly miniaturized circuitry having a feature size less than about 0.13 micron.

SUMMARY OF THE INVENTION

An advantage of the present invention is a semiconductor device having a highly reliable interconnection pattern with features in the deep-sub micron regime.

Another advantage of the present invention is a method of manufacturing a semiconductor device comprising a highly reliable interconnection pattern with features in the deep-sub micron regime.

Additional advantages and features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer overlying a substrate; forming a first barrier layer, comprising a first dielectric barrier material, on the first dielectric layer; etching to form a first opening defined by side surfaces of the first dielectric layer and a bottom; forming a second barrier layer, comprising a second dielectric barrier material different from the first dielectric barrier material, on an upper surface of the first barrier layer overlying the first dielectric layer, on the side surfaces of the first dielectric layer defining the first opening and on the bottom of the first opening; etching with selectivity to the first barrier layer to remove the second barrier layer from, and stopping on, the upper surface of the first barrier layer, and to remove the second barrier layer from the bottom of the first opening leaving a portion of the second barrier layer as a liner on the side surfaces of the first dielectric layer defining the first opening; and filling the opening with a metal to form a lower metal feature.

Another aspect of the present invention is a semiconductor device comprising a metal feature comprising copper (Cu) or a Cu alloy, formed in an opening defined by side surfaces of a first dielectric layer having a first barrier layer, comprising a first dielectric barrier material, thereon; a first barrier liner, comprising a second dielectric barrier material different from the first dielectric barrier material, on the side surfaces of the first dielectric layer between the lower metal feature and the first dielectric layer, wherein the first barrier liner has an upper surface extending to a distance below an upper surface of the first dielectric layer.

Embodiments of the present invention include dual damascene techniques implemented to form a dual damascene structure having a line and via electrically connected to the lower metal feature. The dual damascene structure is implemented by forming a dual damascene opening, and then forming a dielectric liner on the side surfaces of the dielectric layers in which the dual damascene opening is formed. The barrier layers employed can be selected from various dielectric materials, such as silicon nitride, silicon oxynitride and silicon carbide, and can be deposited at a suitable thickness, such as about 50 Å to about 500 Å. Embodiments of the present invention further comprise dual damascene structures containing Cu metallization.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and descriptions are to regarding as illustrative in nature and not as restrictive.

BRIEF DESCRIPTION OF THE DRAWINGS

In FIGS. 1 through 10, like features or elements are denoted by like reference numerals.

DESCRIPTION OF THE INVENTION

Figure 1:
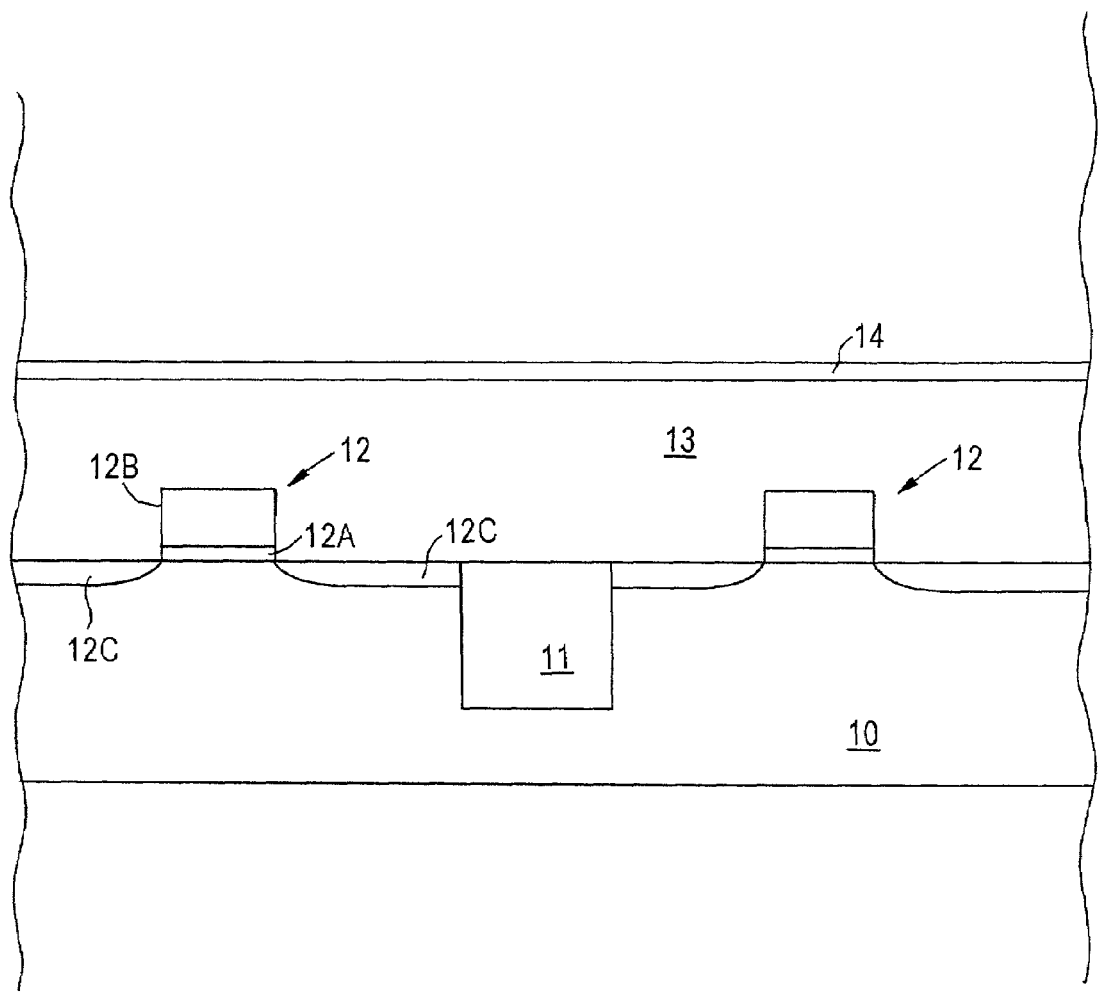
FIGS. 1 through 10 schematically illustrate sequential phases of methodology inclusive of embodiments of the present invention.

The present invention provides methodology enabling the formation of semiconductor devices having interconnection patterns with improved step coverage, reduced contact resistance, enhanced electromigration resistance, reduced capacitance and misalignment tolerance. These objectives are achieved by the strategic use of a dielectric barrier layer in lieu of a metal-containing or metallic barrier layer. Advantageously, in accordance with embodiments of the present invention dielectric barrier layers are deposited by chemical vapor deposition (CVD) and, hence, exhibit superior step coverage, particularly vis-à-vis a conventional sputter deposited metal barrier layer. Moreover, dielectric barrier layers can be deposited with greater uniformity then conventional metal-containing barrier layers. In implementing various embodiments of the present invention, dielectric barrier layers can comprise suitable dielectric barrier materials, such as a silicon nitride, silicon carbide or silicon oxynitride. In addition, as a metallic barrier layer is not deposited in the via and line, the contact resistance is significantly reduced by employing a dielectric barrier layer. Further, the direct copper via/line contact enhances electromigration. Embodiments of the present invention also enable a reduction in parasitic capacitance. Advantageously, the use of two different dielectric barrier layers in accordance with embodiments of the present invention provides increased tolerance for misalignment.

In implementing various embodiments of the present invention, dielectric layers can be formed from various dielectric materials conventionally employed in the manufacture of semiconductor device, particularly, dielectric materials with lower values of primitivity, such as "low-k" dielectric materials. The expression "low-k" material has evolved characterized materials with a dielectric constant less than about 3.9, based upon the value of the dielectric constant of a vacuum as one (1). Suitable dielectric materials for use in accordance with embodiments of the present invention include: flowable oxides, such as hydrogen silsesquioxane (HSQ) and methyl silsesquioxane (MSQ), and various organic low-k materials, typically having a dielectric constant of about 2.0 to about 3.8, such as FLARE 20™ dielectric, a poly(arylene) ether, available from Allied Signal, Advanced Micromechanic Materials, Sunnyvale, Calif., Black-Diamond™ dielectric available from Applied Materials, Santa Clara, Calif., BCB (divinylsiloxane bis-benzocyclobutene) and Silk™ dielectric, an organic polymer similar to BCB, both available from Dow Chemical Co., Midland, Mich. Other suitable low-k dielectric include poly (arylene)ethers, poly(arylene)ether azoles, parylene-N, polyimides, polynapthalene-N, polyphenyl-quinoxalines (PPQ), polyphenyleneoxide, polyethylene and polypropylene. Additional low-k dielectric materials suitable for use in embodiments of the present invention include $FO_x$™ (HSQ-based), XLK™ (HSQ-based), and SILK™, an aromatic hydrocarbon polymer (each available from Dow Chemical Co., Midland, Mich.); Coral™, a carbon-doped silicon oxide (available from Novellus Systems, San Jose, Calif.); Flare™, an organic polymer, HOSP™, a hybrid-siloxane-organic polymer, and Nanoglass™, a nonporous silica (each available from Honeywell Electronic Materials); and halogen-doped (e.g., fluorine-doped) silicon dioxide derived from tetraethyl orthosilicate (TEOS) and fluorine-doped silicate glass (FSG).

The present invention is particularly applicable to interconnect technology involving damascene techniques. Thus, embodiments of the present invention comprise depositing a layer comprising a low-k material, and forming an opening in the low-k dielectric layer by damascene techniques, including dual damascene techniques. The openings formed in the low-k dielectric layer can be a via hole which is subsequently filled with a metal, such as copper (Cu) or a Cu alloy, to form a via interconnecting upper and lower metal lines, or a contact hole in which case the Cu or Cu alloy filled contact hole electrically connects a first metal layer with a source/drain region in the semiconductor substrate. The opening in the low-k dielectric layer can also be a trench, in which case the filled trench forms an interconnection line. The opening can also be formed by a dual damascene technique, in which a via/contact communicating with a line is simultaneously formed by metal deposition.

In implementing Cu damascene techniques, a barrier layer is typically initially deposited in the damascene opening and a seedlayer deposited thereon. Suitable seedlayers include, copper alloys containing magnesium, aluminum, zinc, zirconium, tin, nickel, palladium, silver or gold in a suitable amount, e.g., about 0.3 to about 12 at. %.

Figure 2:
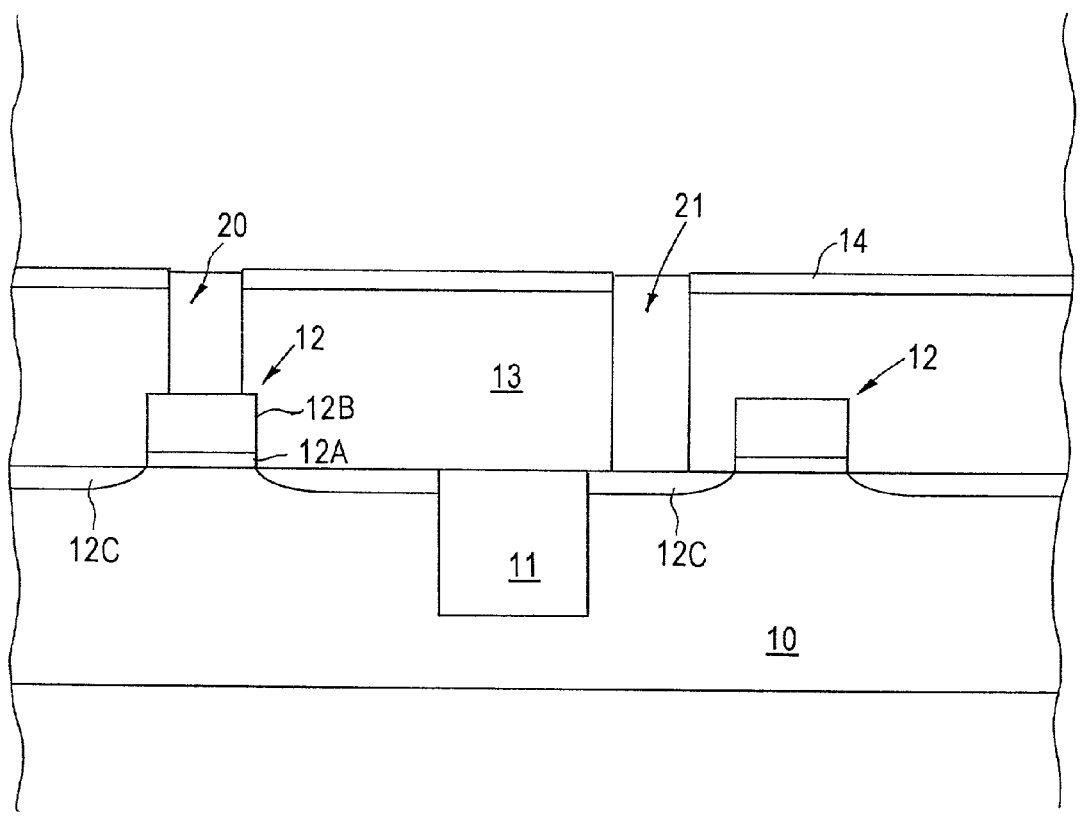

FIGS. 1 through 10 schematically illustrate sequential phases inclusive of embodiments within the scope of the present invention. Adverting to FIG. 1, active regions formed in a semiconductor substrate 10 are shown isolated by shallow trench isolation 11. Such active regions include transistors 12 comprising gate oxide layer 12A, gate electrode 12B thereon and source/drain regions 12C. An interlayer dielectric (ILD) 13 is formed overlying the substrate and a barrier layer 14, such as a silicon carbide, silicon oxynitride or silicon nitride, is formed thereon, typically at a thickness of about 50 Å to about 500 Å. As shown in FIG. 2, plug openings are formed in ILD 13 and filled with metal, such as tungsten, to form plug 20 connected to transistor 12 and plug 21 connected to a source/drain region 12C.

Figure 3:
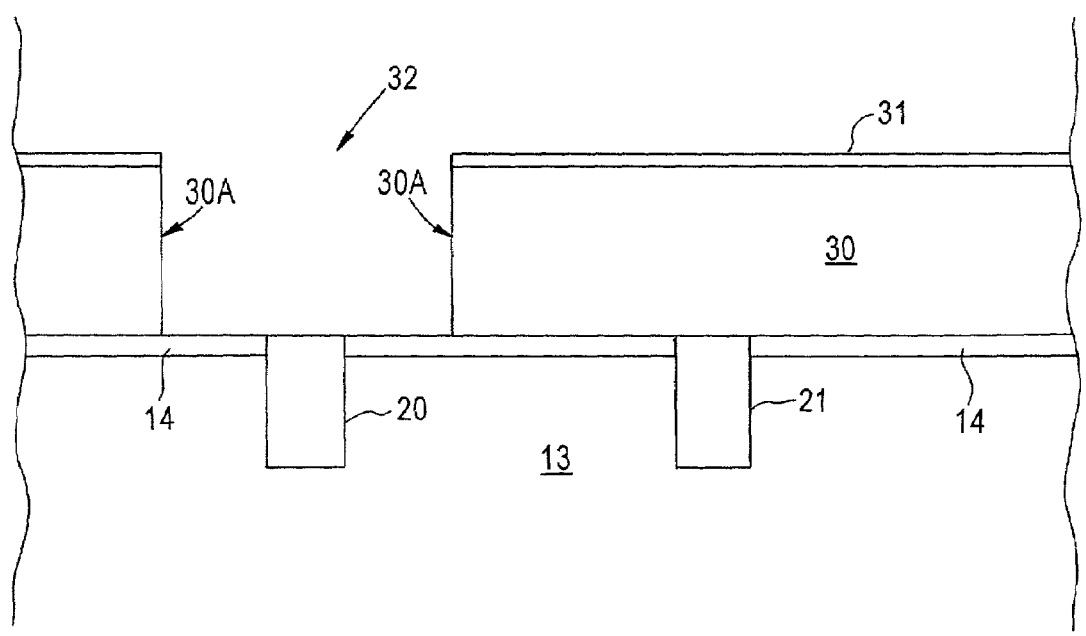
Figure 4:
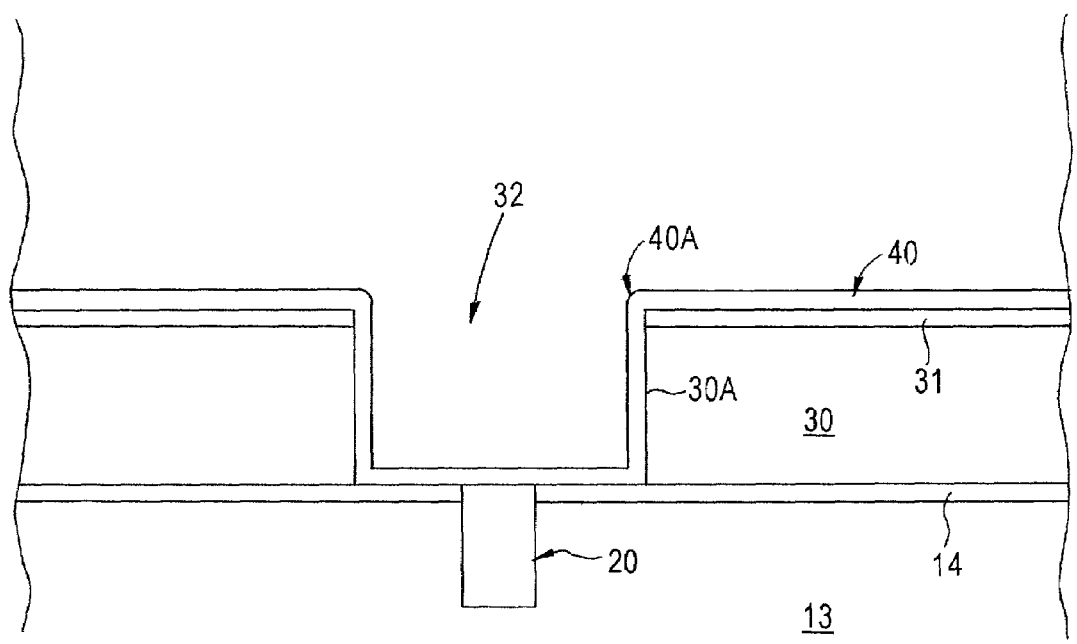

Adverting to FIG. 3, a dielectric layer 30 is formed overlying ILD 13 on barrier layer 14, a barrier layer 31 formed on ILD 30, and a damascene opening 32, such as a trench, is formed in dielectric layer 30 defined by side surfaces 30A of dielectric layer 30. A dielectric barrier layer 40, as shown in FIG. 4, is then deposited, as by chemical vapor deposition, on barrier layer 31 lining opening 32. Barrier layer 40 exhibits high conformity and rounded corners 40A at the corners of trench 32. Barrier layer 40 comprises a dielectric material different from the dielectric material of barrier layer 31, such that barrier layer 31 functions as an etch stop layer during subsequent etching. The various barrier layers deposited in accordance with embodiments of the present invention can comprise a material such as a silicon nitride, silicon oxynitride or silicon carbide.

Figure 5:
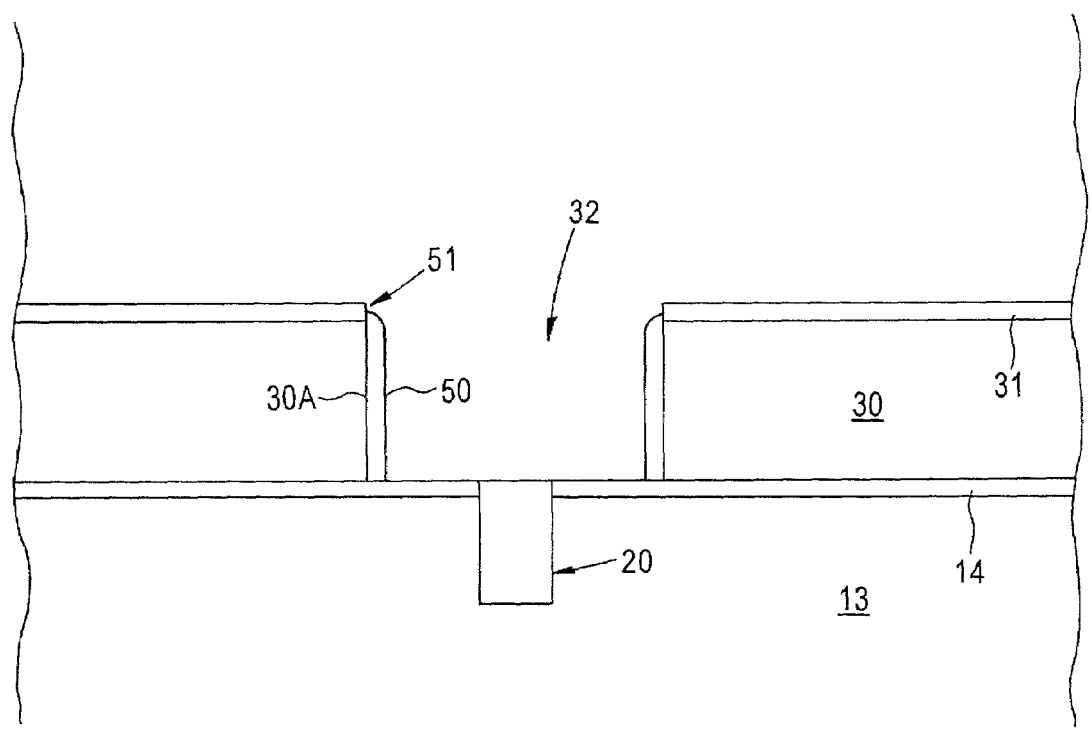

Anisotropic etching is then conducted to remove barrier layer 40 from the upper surface of barrier layer 31 and the bottom of trench 32 leaving a dielectric liner 50 on the side surfaces 30A of dielectric layer 30 defining trench 32, as illustrated in FIG. 5. After anisotropic etching, the upper surface of dielectric liner 50 may extend below the upper surface of dielectric barrier layer 31, as shown by reference numeral 51, following anisotropic etching. Typically, the distance between the upper surface of dielectric liner 50 and the upper surface of dielectric barrier layer 31 is about 50 Å to about 500 Å.

Figure 6:
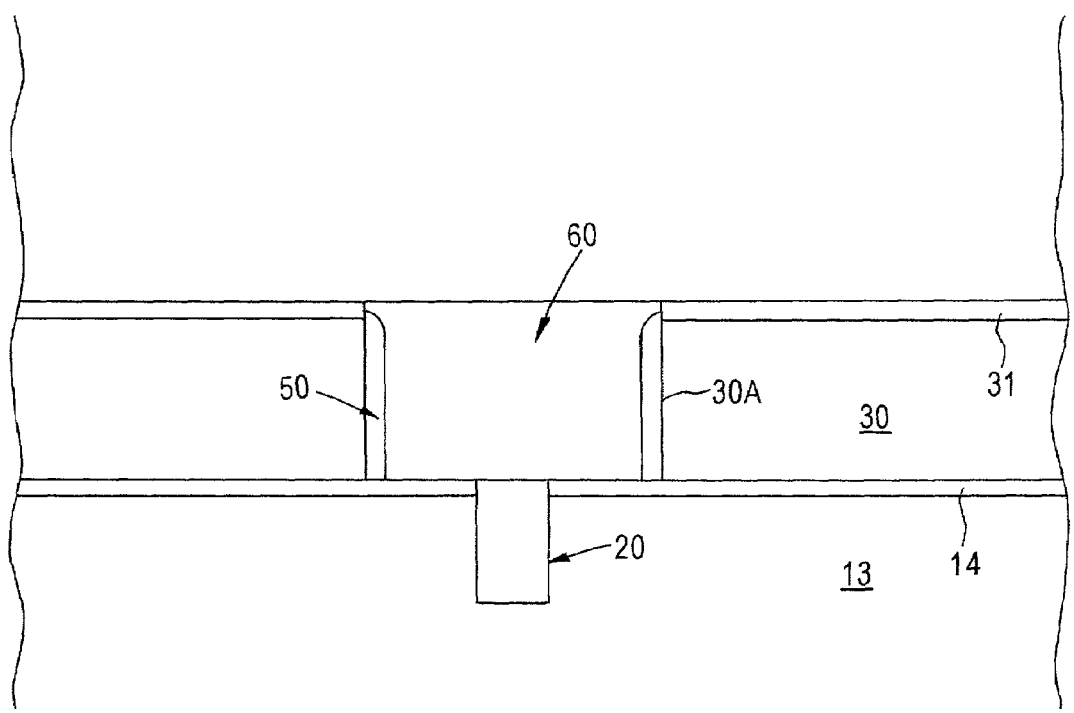

Trench 32 is then filled with metal and followed by chemical mechanical polishing (CMP) to form metal line 60, as shown in FIG. 6. Embodiments of the present invention include electrodepositing or electrolessly deposited copper to form metal line 60. In such case, a barrier layer and seedlayer are typically deposited prior to filling opening 32.

Figure 7:
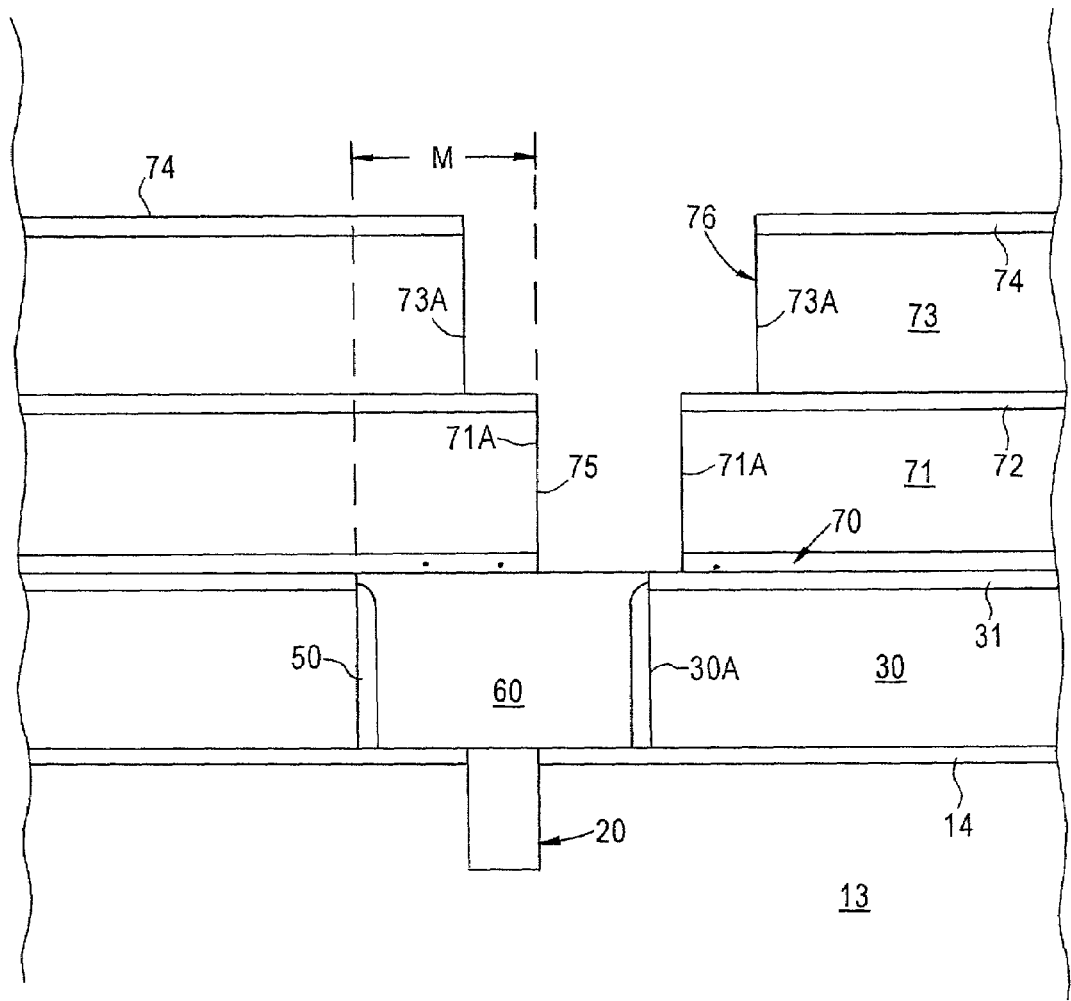

Various types of dual damascene structures are encompassed by embodiments of the present invention, including via first-trench last and trench first-via last dual damascene techniques. Dual damascene processing is exemplified in FIGS. 7 through 10 building on metal line 60. As shown in FIG. 7, a dielectric barrier layer 70 is then deposited comprising a dielectric barrier material different from that of dielectric barrier layer 31. Dielectric layers 71 and 73 are then deposited with a dielectric barrier layer 72 therebetween, and a dielectric barrier layer 74 formed on dielectric layer 73. A dual damascene opening is then formed comprising a trench 76 defined by side surfaces 73A of dielectric layer 73 and a via hole 75 connected thereto and defined by side surfaces 71A of dielectric layer 71. The dual damascene structure can be formed by a conventional via first-trench last technique or a conventional trench first-via last technique.

Advantageously, embodiments of the present invention provide a tolerance for misalignment. As shown in FIG. 7, via hole 75 is misaligned with respect to lower metal feature 60 such that the bottom of via hole 75 is formed partly on an upper surface of metal line 60 and partly on an upper surface of dielectric barrier layer 31 strategically preventing spiking. Thus, via hole 75 is offset from a side surface of metal feature 60 by distance "M" which would exceed the distance required for fulling landing on lower metal feature 60.

Figure 8:
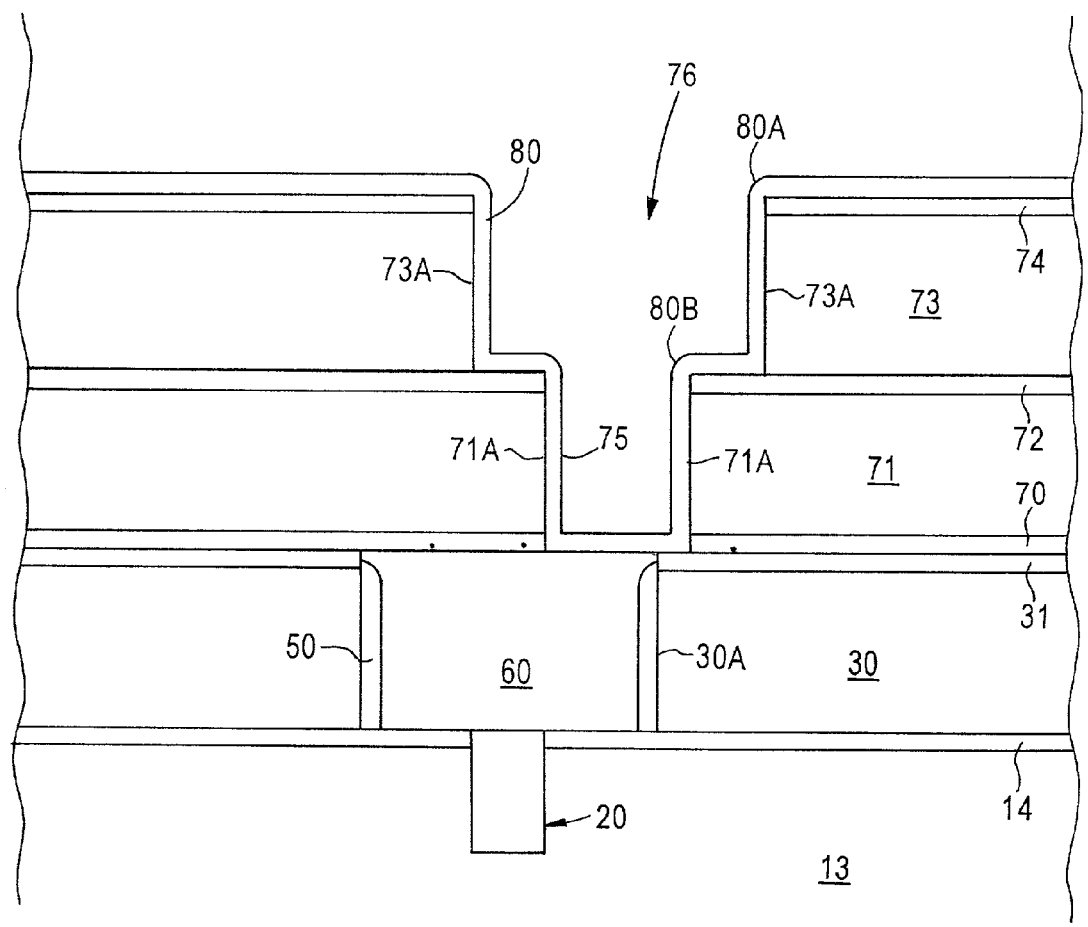
Figure 9:
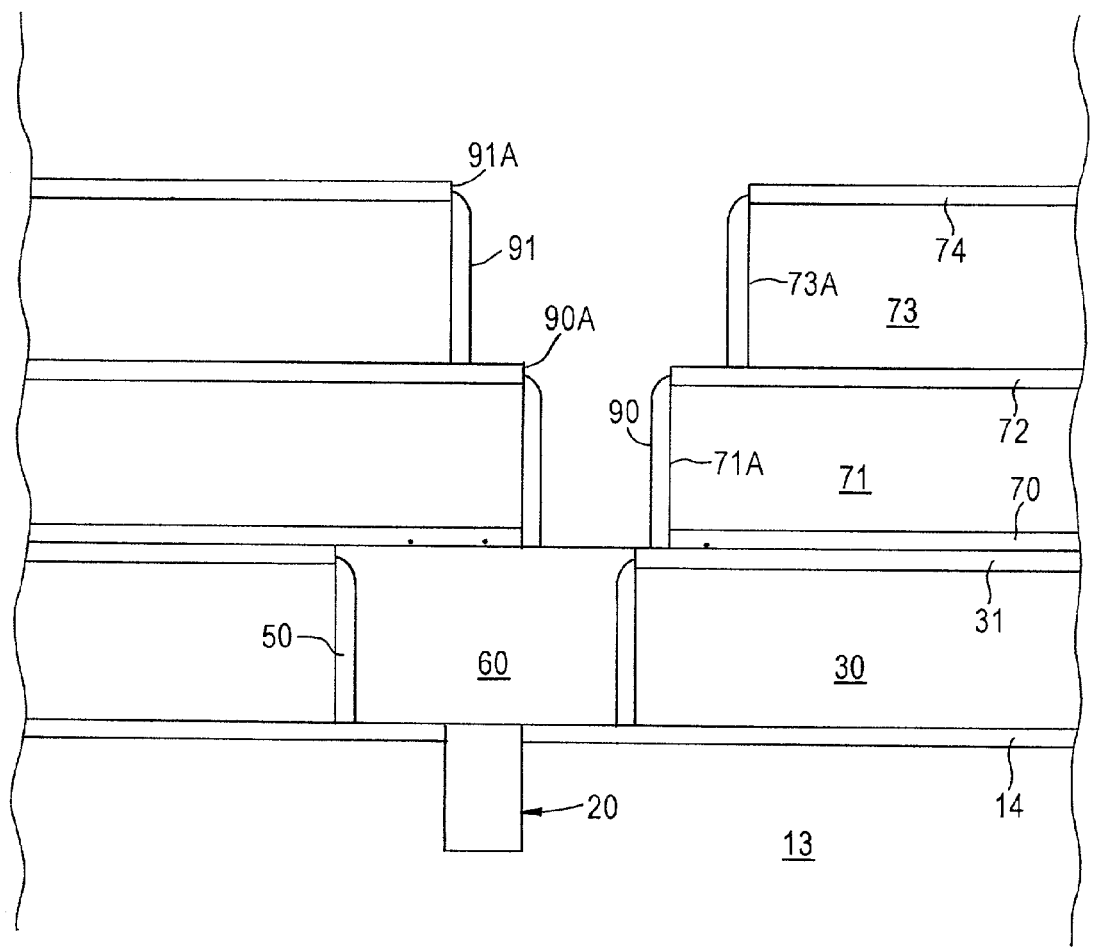
Figure 10:
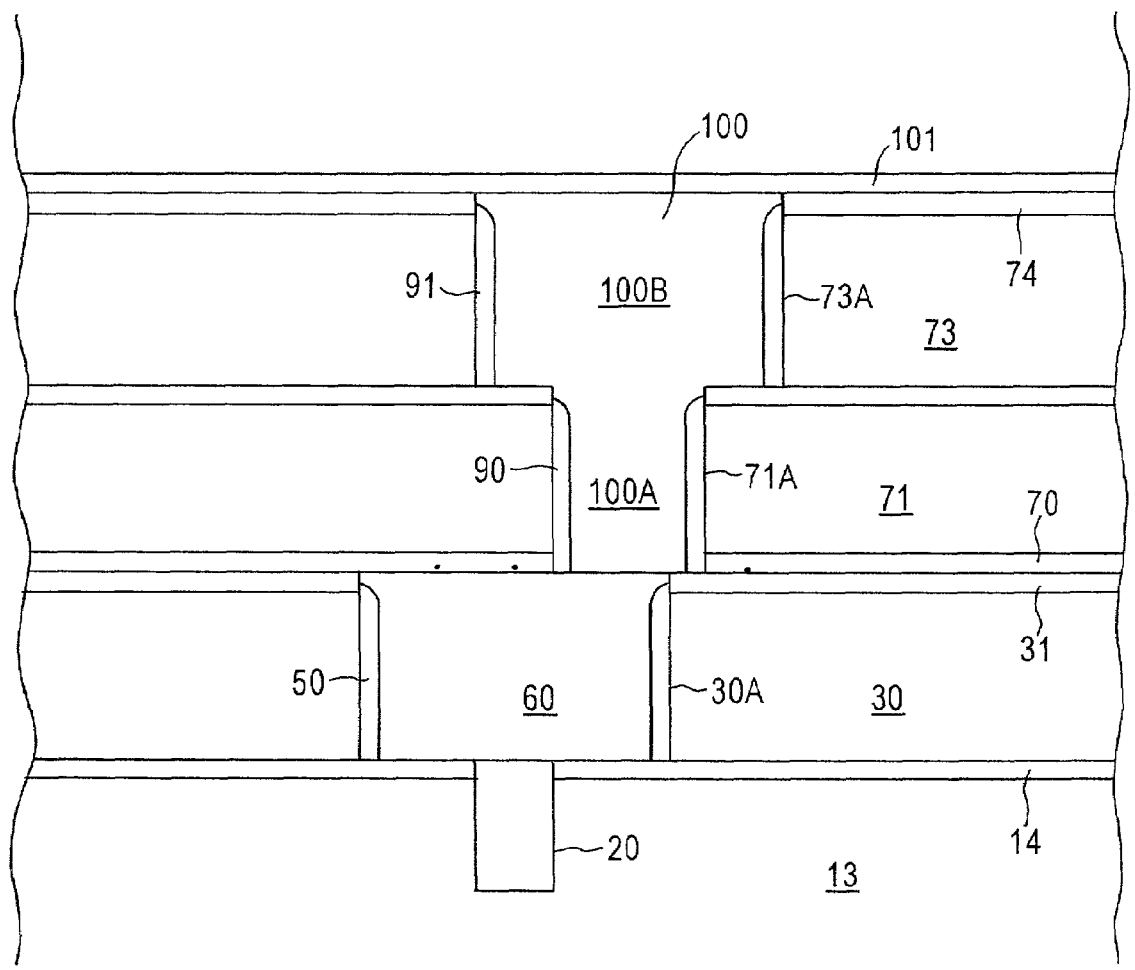

A dielectric barrier layer 80, as shown in FIG. 8, is then deposited to line the dual damascene opening and on the upper surface of dielectric layer 74, with rounded corners 80A. Dielectric layer 80 comprises a dielectric material which is different from the dielectric material employed for dielectric barrier layer 74, dielectric barrier layer 72 and dielectric barrier layer 31, such that dielectric barrier layers 74, 72 and 31 function as etch stop layers during formation of the dielectric liner for the dual damascene opening. Anisotropic etching is then conducted to remove a portion of the dielectric layer 80 from the upper surface of dielectric barrier layer 74, from the upper surface of exposed portion of dielectric barrier layer 72 between via hole 75 and trench 76, and to remove the portion of dielectric layer 80 from the bottom of via hole 75. The resulting structure is shown in FIG. 9 and also comprises a slight gap 90A between the upper surface of the dielectric liner 90 formed on the side surfaces of dielectric layer 71 and the upper surface of dielectric barrier layer 72, and a slight gap 91A between the upper surface of dielectric liner 91 and the upper surface of dielectric barrier layer 74, e.g., at about 50 Å to about 500 Å. The dual damascene opening is then filled with a metal, such as Cu, and CMP is then conducted so that the upper surface of the deposited metal 100 is substantially coplanar with the upper surface of barrier layer 74. Another dielectric barrier layer or capping layer 101 is then deposited to encapsulate the metallization 100 which comprises metal line 100B connected to via 100A electrically connected to lower metal feature 60. In implementing Cu metallization, a barrier layer and seedlayer are deposited.

Advantageously, semiconductor devices formed in accordance with embodiments of the present invention contain highly reliable interconnection patterns exhibiting reduced electromigration, reduced parasitic capacitance and reduced contact resistance. The use of a dielectric barrier layer enables uniform step coverage and provides greater tolerance for misalignment.

The present invention enjoys industrial applicability in manufacturing various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   forming a single first dielectric layer overlying a substrate;
   forming a first barrier layer, comprising a first dielectric barrier material, on the single first dielectric layer with an interface therebetween,
   etching to form a single opening entirely within and defined by side surfaces of the single first dielectric layer and a bottom over an underlying conductive feature;
   forming a second barrier layer, comprising a second dielectric barrier material different from the first dielectric barrier material, on and in contact with an entire upper surface of the first barrier layer overlying the single first dielectric layer, on the side surfaces of the single first dielectric layer defining the single opening and on the bottom of the single opening;
   etching, with selectivity to the first barrier layer, to remove the second barrier layer from, and stopping on, the upper surface of the first barrier layer, and to remove the second barrier layer from the bottom of the single opening exposing the underlying conductive feature, leaving a portion of the second barrier layer as a liner on the side surfaces of the single first dielectric layer defining the single opening;
   filling the single opening with metal forming an overburden on the first barrier layer; and
   planarizing to form a lower metal feature.

2. The method according to claim 1, wherein the first and second dielectric barrier materials are selected from the group consisting of silicon nitride, silicon oxynitride and silicon carbide.

3. The method according to claim 2, comprising depositing each of the first and second barrier layers by chemical vapor deposition.

4. The method according to claim 3, comprising depositing each of the first and second barrier layers at a thickness of about 50 Å to about 500 Å.

5. The method according to claim 1, comprising filling single opening with copper (Cu) or a Cu alloy.

6. The method according to claim 1, comprising etching to form the single opening having entire side surfaces which are substantially parallel.

7. The method according to claim 1, comprising etching to remove the second barrier layer leaving a portion of the second barrier as a liner on the side surfaces of the single first dielectric layer with a gap between an upper surface of the liner and an upper surface of the first barrier layer.

8. The method according to claim 7, wherein the gap is about 50 Å to about 500 Å.

9. A method of manufacturing a semiconductor device, the method comprising:
   forming a first dielectric layer overlying a substrate;
   forming a first barrier layer, comprising a first dielectric barrier material, on the first dielectric layer;
   etching to form a first opening defined by side surfaces of the first dielectric layer and a bottom;
   forming a second barrier layer, comprising a second dielectric barrier material different from the first dielectric barrier material, on an upper surface of the first barrier layer overlying the first dielectric layer, on the side surfaces of the first dielectric layer defining the first opening and on the bottom of the opening;
   etching, with selectivity to the first barrier layer, to remove the second barrier layer from, and stopping on, the upper surface of the first barrier layer, and to remove the second barrier layer from the bottom of the first opening, leaving a portion of the second barrier layer as a liner on the side surfaces of the first dielectric layer defining the first opening;
   filling the opening with metal to form a lower metal feature;
   forming a third barrier layer, comprising a third dielectric barrier material different from the first dielectric barrier material, on the first barrier layer and on an upper surface of the lower metal feature;
   forming a second dielectric layer on the third barrier layer;
   forming a fourth barrier layer, comprising a fourth dielectric barrier material, on the second dielectric layer;
   forming a third dielectric layer on the fourth barrier layer;
   forming a fifth barrier layer, comprising a fifth dielectric barrier material, on the third dielectric layer;
   etching to form a dual damascene opening comprising an upper trench portion defined by side surfaces of the third dielectric layer in communication with a lower via hole defined by side surfaces of the second dielectric layer and a bottom on at least a portion of the upper surface of the lower metal feature;
   forming a sixth barrier layer, comprising a sixth dielectric barrier material different from the first, fourth and fifth dielectric materials, on the fifth barrier layer overlying the third dielectric layer, on the side surfaces of the third dielectric layer defining the trench, on the side surfaces of the second dielectric layer defining the via hole, on a portion of the fourth barrier layer between the trench and via hole, and at a bottom of the via hole;
   etching to remove the sixth barrier layer from, and stopping on, the fifth barrier layer, from and stopping on the fourth barrier layer, and at the bottom of the via hole, leaving a portion of the sixth barrier layer as a liner on the side surfaces of the third dielectric layer defining the trench and on the side surfaces of the second dielectric layer defining the via hole; and
   filling the dual damascene opening with metal to form a metal line connected to an underlying metal via.

10. The method according to claim 9, comprising filling the dual damascene opening with copper (Cu) or a Cu alloy to form a Cu or Cu alloy line connected to a Cu or Cu via which is electrically connected to the lower metal feature.

11. The method according to claim 10, wherein the lower metal feature comprises a Cu or Cu alloy line.

12. The method according to claim 10, wherein the dual damascene opening is misaligned with respect to the lower metal feature such that the bottom of the via hole is on a portion of the upper surface of the lower metal feature and on a portion of an upper surface of the first barrier layer.

13. The method according to claim 9, further comprising depositing a seventh barrier layer, comprising a seventh dielectric barrier material, on an upper surface of the sixth barrier layer and on an upper surface of the metal line.

14. The method according to claim 9, wherein the first, second, third, fourth, fifth and sixth dielectric barrier materials are selected from the group consisting of silicon nitride, silicon carbide and silicon oxynitride.

15. The method according to claim 9, comprising depositing each of the first, second, third, fourth, fifth and sixth barrier layers at a thickness of about 50 Å to about 500 Å.

* * * * *